US009353433B2

(12) United States Patent
Kim et al.

(10) Patent No.: US 9,353,433 B2
(45) Date of Patent: **\*May 31, 2016**

(54) METHOD OF FABRICATING LIQUID FOR OXIDE THIN FILM

(71) Applicant: Industry-Academic Cooperation Foundation, Yonsei University, Seodaemun-gu, Seoul (KR)

(72) Inventors: Hyun Jae Kim, Seoul (KR); Kyung Ho Kim, Seoul (KR); Gun Hee Kim, Seoul (KR); Tae Hoon Jeong, Seoul (KR); Hyun Soo Shin, Seoul (KR); Won Jun Park, Seoul (KR); Yun Jung Choi, Seoul (KR); Ka Young Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 203 days.

This patent is subject to a terminal disclaimer.

(21) Appl. No.: 14/014,551

(22) Filed: Aug. 30, 2013

(65) Prior Publication Data

US 2014/0000480 A1 Jan. 2, 2014

Related U.S. Application Data

(63) Continuation of application No. 12/739,657, filed as application No. PCT/KR2008/000864 on Feb. 14, 2008, now Pat. No. 8,523,996.

(30) Foreign Application Priority Data

Oct. 24, 2007 (KR) .................... 10-2007-0107336

(51) Int. Cl.
| | |
|---|---|
| *C23C 6/00* | (2006.01) |
| *C23C 18/12* | (2006.01) |
| *H01L 21/02* | (2006.01) |
| *C23C 18/08* | (2006.01) |
| *C23C 30/00* | (2006.01) |

(52) U.S. Cl.
CPC . *C23C 6/00* (2013.01); *C23C 18/08* (2013.01); *C23C 18/1216* (2013.01); *C23C 18/1254* (2013.01); *C23C 30/00* (2013.01); *H01L 21/02554* (2013.01); *H01L 21/02565* (2013.01); *H01L 21/02628* (2013.01)

(58) Field of Classification Search
CPC .. C23C 6/00; C23C 18/1216; C23C 18/1254; C23C 30/00; H01L 21/02554; H01L 21/02565; H01L 21/02628

USPC ................................................ 106/287.18
See application file for complete search history.

(56) References Cited

U.S. PATENT DOCUMENTS

2007/0184576 A1\* 8/2007 Chang et al. ................. 438/104

FOREIGN PATENT DOCUMENTS

| JP | 2003-002650 A | 1/2003 |
|---|---|---|
| JP | 2005-154654 A | 6/2005 |
| KR | 10-2001-0090005 A | 10/2001 |

OTHER PUBLICATIONS

International Search Report for Appln. No. PCT/KR2008/00864 dated Jul. 11, 2008.
Caglar et al, "Effects of in,Al and Sn dopants on the structural and optical properties of ZnO thin films", Spectrochimica Acta Part A, (2007) pp. 1113-1119.
Caglar et al, "influence of dopant concentration of the optical properties of ZnO: in films by sol-gel method", Thin Solid Films, 517 (2009) pp. 5023-5028.
Lee et al, "Highly textured ZnO thin films doped with indium prepared by the pyrosol method", Solar Energy Materials and SolarCells, 43 (1996) pp. 37-45.
Lee et al, "Transparent conducting ZnO:Al, In and Sn thin films deposited by the sol-gel method", Thin Solid Films, 426 (2003) pp. 94-99.

\* cited by examiner

*Primary Examiner* — David M Brunsman
(74) *Attorney, Agent, or Firm* — Carter, DeLuca, Farrell & Schmidt, LLP

(57) ABSTRACT

A method of fabricating a liquid for an oxide thin film is provided, which includes mixing at least two kinds of dispersoids selected from the group consisting of a Zinc compound, an Indium compound, a Gallium compound, a Tin compound and a Thallium compound, with dispersion media corresponding to the selected dispersoids to form a dispersion system, and stirring and aging the dispersion system at a predetermined temperature for a predetermined time, wherein a molar ratio of the Zinc compound to each of the Indium compound, Gallium compound, Tin compound and Thallium compound is 1:0.1 to 1:2. According to the present invention, the liquid for the oxide thin film may be fabricated by a sol-gel method making it capable of being implemented in mass production in a simple and low-cost manner as opposed to the conventional vacuum deposition method.

16 Claims, 3 Drawing Sheets

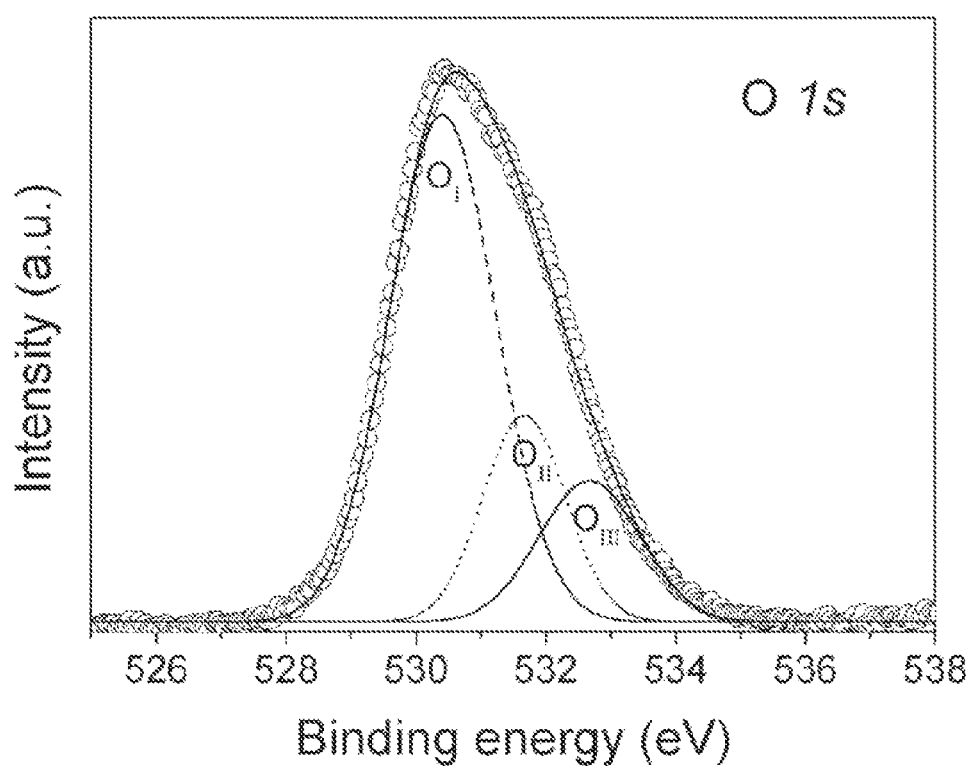

METHOD OF FABRICATING LIQUID FOR OXIDE THIN FILM

CROSS REFERENCE TO RELATED APPLICATIONS

This application is a continuation of U.S. patent application Ser. No. 12/739,657, filed Apr. 23, 2010, which is a U.S. National Stage of International Application No. PCT/KR2008/000864 filed on Feb. 14, 2008, which claims priority from Korean Patent Application No. 10-2007-0107336 filed on Oct. 24, 2007, the disclosures of each of which are hereby incorporated by reference herein in their entirety.

TECHNICAL FIELD

The present invention relates to a method of fabricating a liquid for an oxide thin film, and more particularly, to a method of fabricating a liquid for an oxide thin film using a sol-gel method capable of implementing mass production.

BACKGROUND ART

Recently, oxide thin films have been usefully employed in displays and semiconductor devices. In particular, a Zinc Oxide (ZnO) is a II-VI group direct transition semiconductor and has a high band gap of 3.37 eV so that it is transparent in a visible light region. Also, the Zinc Oxide (ZnO) has an exciton bond energy of 60 meV and is thus widely employed as an optical element (see D. C. Look et al. "Recent advances in ZnO materials and devices" Materials Science and Engineering: B 80, 383, (2001)).

The Zinc Oxide may have n-type characteristics due to native defects such as interstitial Zinc and oxygen vacancies, and may change electrical properties up to $10^{-2}$ to $10^{10}$ Ωm depending on process conditions. In this case, the electron concentration may be further increased to use the Zinc Oxide as a transparent electrode, for which III-group elements or VII-group elements are doped thereinto, Gallium (Ga), Aluminum Al), and Indium (In), which belong to the III-group, are representative dopants, and materials doped with Ga, Al, and In are named Gallium Zinc Oxide (GZO) (see Quan-Bao et al. "Structural, electrical, and optical properties of transparent conductive ZnO:Ga films prepared by DC reactive magnetron sputtering" Journal of Crystal Growth, 304, 64 (2007)), Aluminum Zinc Oxide (AZO) (see Byeong-Yun Oh et al. "Properties of transparent conductive ZnO:Al films prepared by co-sputtering" Journal of Crystal Growth, Volume 274, 453, (2005)), and Indium Zinc Oxide (IZO) (see E. J. Luna-Arredondo et al. "Indium-doped ZnO thin films deposited by the solgel technique" Thin Solid Films, 490, 132 (2005)), respectively. These transparent electrodes have come into the spotlight as materials capable of taking the place of transparent electrodes formed of Indium Tin Oxides (ITO) which have been widely applied to electronic devices in recent years.

The transparency of ZnO enables it to be implemented in a transparent transistor, and the high mobility of ZnO allows it to be used as an active layer of the transistor of a display device. When ZnO is a bulk, it has a superior mobility of about 200 $cm^2/Vs$ (see D. C. Look et al. "Electrical properties of bulk ZnO" Solid State Commun. 105, 399 (1998)). In addition, ZnO has an ionic bond so that a mobility difference between single crystalline ZnO and amorphous ZnO is not significant compared to Silicon (Si). Such properties allow it to be applied to modern display devices which require an active layer having high mobility. Furthermore, many other elements have been alloyed with a Zinc compound in order to obtain a higher mobility and a stable active layer. Materials having a greater orbital than the 5s-orbital of Zinc and a larger ion radius than Zinc (e.g., Indium, Tin, Thallium) are added to the Zinc compound to form alloys such as In—Ga—ZnO (IGZO), In—ZnO (IZO), Sn—ZnO (SZO), Sn—Ga—ZnO (SGZO), In—Sn—ZnO (ISZO), Tl—ZnO (TZO), and Tl—Ga—ZnO (TGZO). These material share more outermost electrons of the 5s-orbital due to greater positive ions than Zinc, which contributes to the electron mobility. In this case, Gallium of the active layer contributes to adjustment in electrical properties and enhancement of stability.

Currently, research is being performed particularly on IGZO using vacuum equipment associated with pulse laser deposition (PLD), sputtering, chemical vapor deposition (CVD) and so forth to be applied to various display devices. However, when such vacuum equipment is employed, the unit price of the process is increased due to the price of the larger-sized equipment.

DISCLOSURE OF INVENTION

Technical Problem

In order to solve the foregoing and/or other problems, it is an objective of the present invention to provide a method of fabricating a liquid for an oxide thin film using a sol-gel method capable of implementing mass production.

Technical Solution

In one aspect, the invention is directed to a method of fabricating a liquid for an oxide thin film, which includes: mixing at least two kinds of dispersoids selected from the group consisting of a Zinc compound, an Indium compound, a Gallium compound, a Tin compound and a Thallium compound, with dispersion media corresponding to the selected dispersoids to form a dispersion system; and stirring and aging the dispersion system at a predetermined temperature for a predetermined time, wherein a molar ratio of the Zinc compound to each of the Indium compound, Gallium compound, Tin compound and Thallium compound is 1:0.1 to 1:2.

The dispersion media may include at least one selected from the group consisting of isopropanol, 2-methoxyethanol, dimethylformamide, ethanol, deionized water, methanol, acetylacetone, dimethylamineborane, and acetonitrile corresponding to the dispersoids. The Zinc compound may include Zinc citrate dihydrate, Zinc acetate, Zinc acetate dihydrate, Zinc acetylacetonate hydrate, Zinc acrylate, Zinc chloride, Zinc diethyldithiocarbamate, Zinc dimethyldithiocarbamate, Zinc fluoride, Zinc fluoride hydrate, Zinc hexafluoroacetylacetonate dihydrate, Zinc methacrylate, Zinc nitrate hexahydrate, Zinc nitrate hydrate, Zinc trifluoromethanesulfonate, Zinc undecylenate, Zinc trifluoroacetate hydrate, Zinc tetrafluoroborate hydrate, or zinc perchlorate hexahydrate. The Indium compound may include Indium chloride, Indium chloride tetrahydrate, Indium fluoride, Indium fluoride trihydrate, Indium hydroxide, Indium nitrate hydrate, Indium acetate hydrate, Indium acetylacetonate, or Indium acetate. The Gallium compound may include Gallium acetylacetonate, Gallium chloride, Gallium fluoride, or Gallium nitrate hydrate. The Tin compound may include Tin acetate, Tin chloride, Tin chloride dihydrate, Tin chloride pentahydrate, or Tin fluoride. The Thallium compound may include Thallium acetate, Thallium acetylacetonate, Thallium chloride, Thallium chloride tetrahydrate, Thallium cyclopentadienide, Thallium fluoride, Thallium formate, Thallium hexafluoroacetylacetonate, Thallium nitrate, Thallium nitrate trihydrate, Thallium trifluoroacetate, or Thallium perchlorate hydrate. A molar concentration of each of the Zinc compound, Indium compound, Gallium compound, Tin compound and Thallium compound may be 0.1M to 10M. A sol stabilizer having substantially the same molar ratio as the Zinc compound may be mixed with the dispersion system. The sol stabilizer may include at least one kind selected from the group consisting of mono-ethanolamine, di-ethanolamine and tri-ethanolamine. An acid or base for adjusting pH of the dispersion system may be added to the dispersion system. Acetic acid ($CH_3COOH$) may be added as the acid to the dispersion system to lower pH or ammonium hydroxide ($NH_3OH$), potassium hydroxide (KOH) or sodium hydroxide (NaOH) may be added as the base to the dispersion system to increase pH so that the pH range of the dispersion system is 1 to 10. The pH range of the dispersion system may be 3.8 to 4.2. The dispersion system may be stirred at 25° C. to 100° C. for substantially 1 hour to 24 hours. The dispersion system may be aged for substantially 1 hour to 240 hours.

In another aspect, the invention is directed to a method of fabricating a liquid for an oxide thin film, which includes: (a) mixing at least two kinds of dispersoids selected from the group consisting of a Zinc compound, an Indium compound, a Gallium compound, a Tin compound and a Thallium compound, with dispersion media corresponding to the selected dispersoids to form a dispersion system; and (b) stirring and aging the dispersion system at a predetermined temperature for a predetermined time, wherein a molar ratio of the Zinc compound to each of the Indium compound, Gallium compound, Tin compound and Thallium compound is 1:0.1 to 1:2, the dispersion media comprise at least one selected from the group consisting of isopropanol, 2-methoxyethanol, dimethylformamide, ethanol, deionized water, methanol, acetylacetone, dimethylaminoeborane, and acetonitrile corresponding to the dispersoids, and a molar concentration of each of the Zinc compound, Indium compound, Gallium compound, Tin compound and Thallium compound is substantially 0.1M to 10M.

Advantageous Effects

According to the present invention as described above, a method of fabricating an oxide thin film such as IZO, IGZO, ISZO, SZO, SGZO, TGZO, TZO which are being actively researched for display and semiconductor devices, may be executed by a sol-gel method making it capable of being implemented in mass production in a simple and low-cost manner as opposed to the conventional vacuum deposition method.

In addition, the oxide thin film fabricated by a method of fabricating a liquid according to exemplary embodiments of the present invention may be applied to display devices such as organic light emitting diodes (OLEDs) and liquid crystal displays (LCDs), or solar cells.

BRIEF DESCRIPTION OF THE DRAWINGS

FIG. 5 illustrates an O 1s peak as XPS results of in the IGZO thin film shown in FIG. 1.

MODE FOR THE INVENTION

Figure 1:
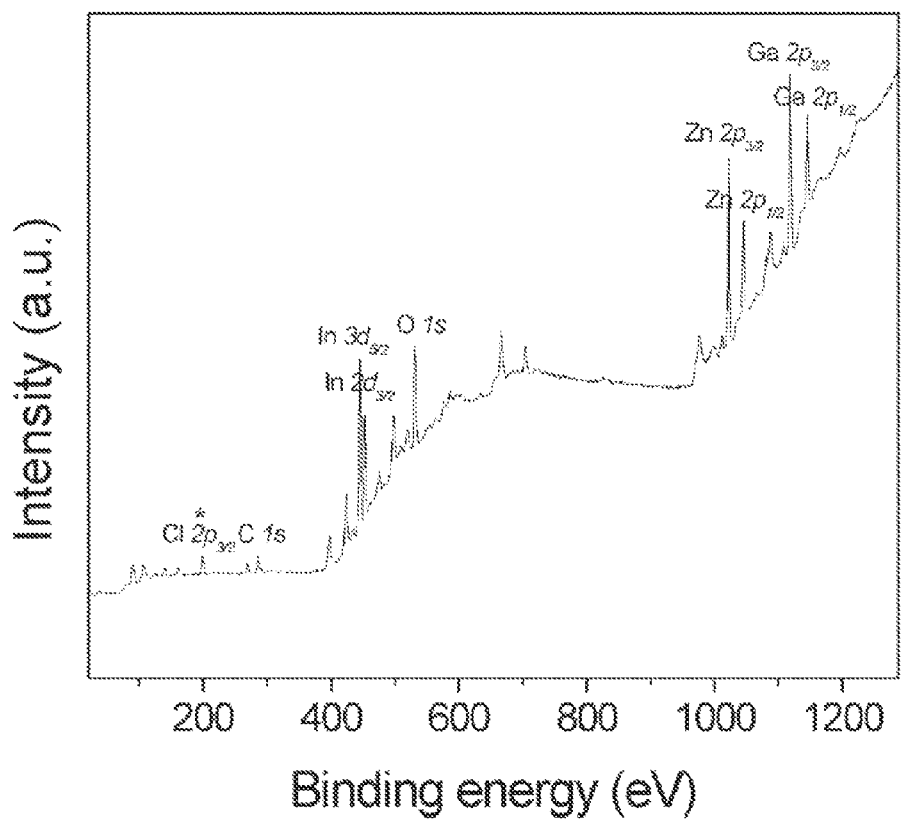
FIG. 1 is a graph illustrating XPS (X-ray photoelectron spectroscopy) results of an Indium-Gallium-Zinc oxide (IGZO) thin film formed by Indium-Gallium-Zinc oxide sol in a method of fabricating a liquid for an oxide thin film according to exemplary embodiments of the present invention.

Hereinafter, exemplary embodiments of the present invention will be described with reference to the accompanying drawings. In the description of the present invention, when the detailed description of functionalities of components or related well-known components may obfuscate the spirit of the present invention, the description thereof will be omitted.

A method of fabricating a liquid for an oxide thin film according to the present exemplary embodiment includes: mixing at least two kinds of dispersoids selected from the group consisting of a Zinc compound, an Indium compound, a Gallium compound, a Tin compound and a Thallium compound, with dispersion media corresponding to the selected dispersoids to form a dispersion system; and stirring and aging the dispersion system at a predetermined temperature for a predetermined time. Meanwhile, molar ratios of the Zinc compound to each of the Indium compound, Gallium compound and Thallium compound are substantially 1:0.1 to 1:2. In this case, when the molar ratios of the Zinc compound to the other illustrated compounds are substantially less than 1:0.1, the compounds act as only a transparent electrode due to a doping effect, and when the molar ratios of the Zinc compound to the other illustrated compounds are substantially greater than 1:2, these other compounds are mixed with the Zinc compound to form an alloy so that an amorphous oxide thin film having high mobility can be produced. However, the other compounds are main components so that the other compounds cannot be fundamental materials for allowing the Zinc compound to have an amorphous structure. Accordingly, it is obvious that the molar ratio of the Zinc compound to each of the Indium compound, Gallium compound, Tin compound and Thallium compound, that is, 1:0.1 to 1:2, are preferable for making an alloy with the Zinc compound.

In this case, the dispersion medium may include at least one selected from the group consisting of isopropanol, 2-methoxyethanol, dimethylformamide, ethanol, deionized water, methanol, acetylacetone, dimethylaminoeborane, and acetonitrile.

In addition, the Zinc compound may include Zinc citrate dihydrate, Zinc acetate, Zinc acetate dihydrate, Zinc acetylacetonate hydrate, Zinc acrylate, Zinc chloride, Zinc diethyldithiocarbamate, Zinc dimethyldithiocarbamate, Zinc fluoride, Zinc fluoride hydrate, Zinc hexafluoroacetylacetonate dihydrate, Zinc methacrylate, Zinc nitrate hexahydrate, Zinc nitrate hydrate, Zinc trifluoromethanesulfonate, Zinc undecylenate, Zinc trifluoroacetate hydrate, Zinc tetrafluoroborate hydrate, or Zinc perchlorate hexahydrate.

The Indium compound may include Indium chloride, Indium chloride tetrahydrate, Indium fluoride, Indium fluoride trihydrate, Indium hydroxide, Indium nitrate hydrate, Indium acetate hydrate, Indium acetylacetonate, or Indium acetate.

The Gallium compound may include Gallium acetylacetonate, Gallium chloride, Gallium fluoride, or Gallium nitrate hydrate.

The Tin compound may include Tin acetate, Tin chloride, Tin chloride dihydrate, Tin chloride pentahydrate, or Tin fluoride.

The Thallium compound may include Thallium acetate, Thallium acetylacetonate, Thallium chloride, Thallium chloride tetrahydrate, Thallium cyclopentadienide, Thallium fluoride, Thallium formate, Thallium hexafluoroacetylacetonate, Thallium nitrate, Thallium nitrate trihydrate, Thallium trifluoroacetate, or Thallium perchlorate hydrate.

Meanwhile, the molar ratio of each of the Zinc compound, Indium compound, Gallium compound, and Thallium compound may be 0.1M (mol/L) to 10M (mol/L).

In addition, a sol stabilizer having substantially the same molar ratio as the Zinc compound illustrated above may be mixed with the dispersion system. For example, the sol stabilizer may include at least one selected from the group consisting of mono-ethanolamine, di-ethanolamine and tri-ethanolamine.

The hydrogen ion exponent of the dispersion system, i.e., pH may be adjusted to add a small amount of acid or base to the mixed dispersion system until the dispersion system is transparent and uniform. For example, acetic acid ($CH_3COOH$) may be added as the acid to the dispersion system to lower pH or ammonium hydroxide ($NH_3OH$), potassium hydroxide (KOH) or sodium hydroxide (NaOH) may be added as the base to the dispersion system to increase pH so that the pH range of the dispersion system is 1 to 10. Preferably, the pH range of the dispersion system may be 3.8 to 4.2.

As described above, after the dispersion system is formed, the dispersion system is stirred at a temperature of 25° C. to 100° C. for substantially 1 hour to 24 hours, and then aged for substantially 1 hour to 240 hours to form corresponding IGZO, IZO, SZO, SGZO, ISZO, TZO, or TGZO.

Hereinafter, exemplary embodiments of the method of fabricating a liquid for an oxide thin film according to the present invention will be described.

First, an exemplary embodiment for forming an IGZO sol will be described as follows.

A 2-methoxyethanol dispersion medium of 20 ml is mixed with a dispersoid containing Zinc acetate dihydrate with substantially 0.7 molar concentration, and a deionized water dispersion medium of 20 ml containing ethanol is mixed with Gallium nitrate hydrate and Indium nitrate hydrate dispersoids to form a dispersion system. Mono-ethanolamine having substantially the same molar ratio as the Zinc acetate dihydrate is then added by a small amount to the already mixed dispersion system. As a result, a milky dispersion system is formed, and an acid, for example, acetic acid, is added thereto by a small amount to make the milky dispersion system transparent and uniform. Meanwhile, pH of the uniform sol is substantially 3.8 to 4.2. The dispersion system is then stirred at 60° C. for 1 hour in a hot plate, and is aged for 24 hours to form a uniform, stable, and aged dispersion system. Accordingly, the IGZO sol is formed.

Second, another exemplary embodiment for forming an IGZO sol will be described as follows.

A deionized water dispersion medium of 40 ml containing methanol is mixed with dispersoids containing Zinc nitrate hexahydrate, Gallium nitrate hydrate and Indium nitrate hydrate each having substantially 0.7 molar concentration to form a dispersion system. The dispersion system is then stirred at 60° C. for 1 hour in a hot plate, and is aged for 24 hours to form a stable and aged dispersion system. Accordingly, the IGZO sol is formed.

Third, still another exemplary embodiment for forming an IGZO sol will be described as follows.

A deionized water dispersion medium of 40 ml containing methanol is mixed with dispersoids containing Zinc acetate dihydrate, Gallium nitrate hydrate and Indium nitrate hydrate each having substantially 0.7 molar concentration to form a dispersion system. An acid, for example, acetic acid, is then added by a small amount to make the dispersion system transparent and uniform. In this case, pH of the uniform sol is substantially 3.8 to 4.2. The dispersion system is then stirred at 60° C. for 1 hour in a hot plate, and is aged for 24 hours to form a uniform, stable and aged dispersion system. Accordingly, the IGZO sol is formed.

Fourth, yet another exemplary embodiment for forming an IGZO sol will be described as follows.

An acetonitrile dispersion medium of 40 ml is mixed with dispersoids containing Zinc chloride, Gallium chloride, and Indium chloride each having substantially 0.5 or 0.7 molar concentration to form a dispersion system. The dispersion system is then stirred at 60° C. for 1 hour in a hot plate, and is aged for 24 hours to form a uniform, stable and aged dispersion system. Meanwhile, since the Zinc chloride, Gallium chloride, and Indium chloride are very susceptible to moisture, the process may be carried out within a moistureless glove box where the moisture may be easily adjusted. Accordingly, the IGZO sol is formed.

A process of fabricating a thin film using the IGZO sol formed by the described exemplary embodiments will be illustrated as follows.

First, spin-coating is performed at a speed of 3000 rpm and than a thermal treatment is performed at 600° C. for 1 hour in the air.

Meanwhile, FIG. 1 is a graph illustrating XPS results of the IGZO thin film formed by the IGZO sol in the method of fabricating the liquid for an oxide thin film according to the present exemplary embodiment. In this case, a reference peak is set to C 1s 285 eV. Peaks of Indium, Gallium, Zinc, Oxygen, and a small amount of Chlorine are represented in the formed IGZO thin film. As shown in FIG. 1, rates of the elements, i.e., Indium, Gallium, Zinc, and Oxygen, are 15.39%, 12.67%, 15.45%, and 56.49%, respectively. That is, it can be seen that the IGZO thin film is formed.

For reference, detailed chemical reactions regarding the formation of the IGZO thin film are as follows.

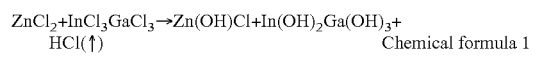

(IGZO thin film at room temperature)

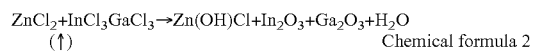

(IGZO thin film at substantially 100° C. to 150° C.)

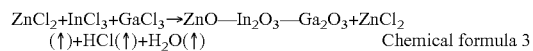

(IGZO thin film at substantially 400° C. to 600° C.)

Figure 2:
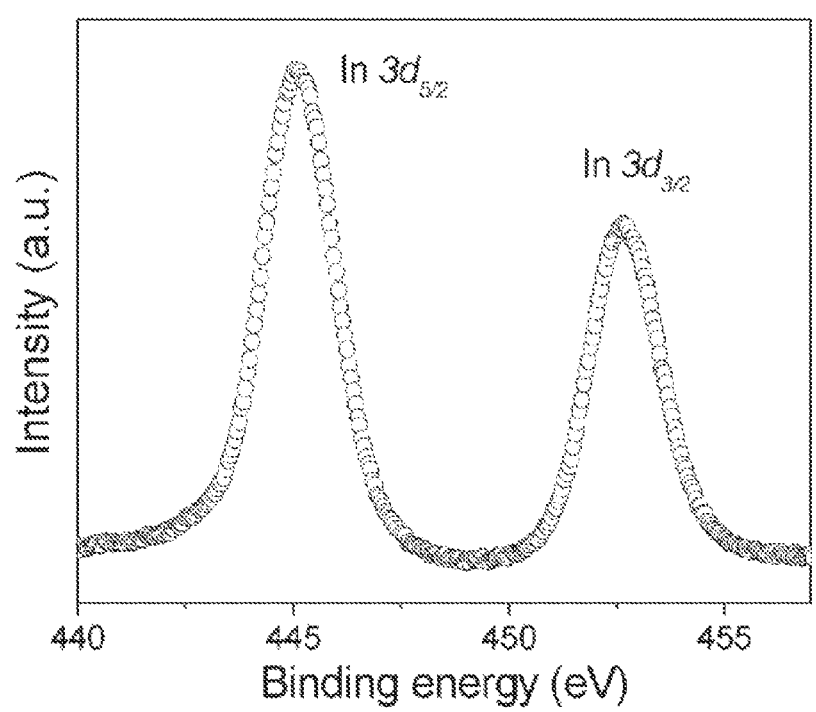
FIG. 2 illustrates XPS results of In $3d_{5/2}$ region in the IGZO thin film shown in FIG. 1.
Figure 3:
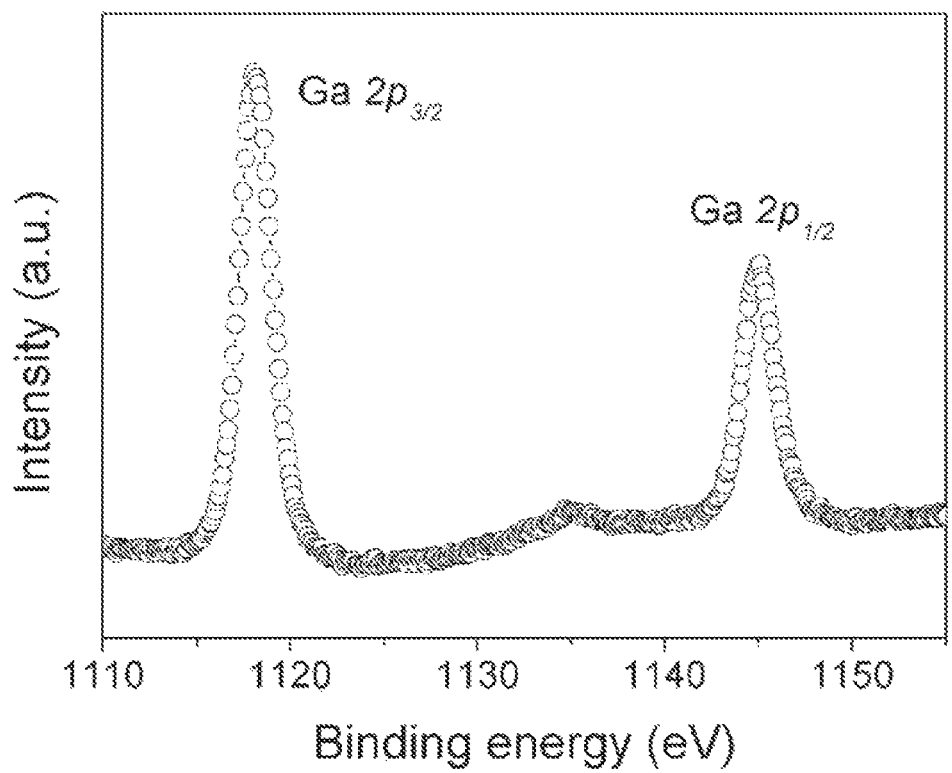
FIG. 3 illustrates XPS results of Ga $2p_{3/2}$ region in the IGZO thin film shown in FIG. 1.
Figure 4:
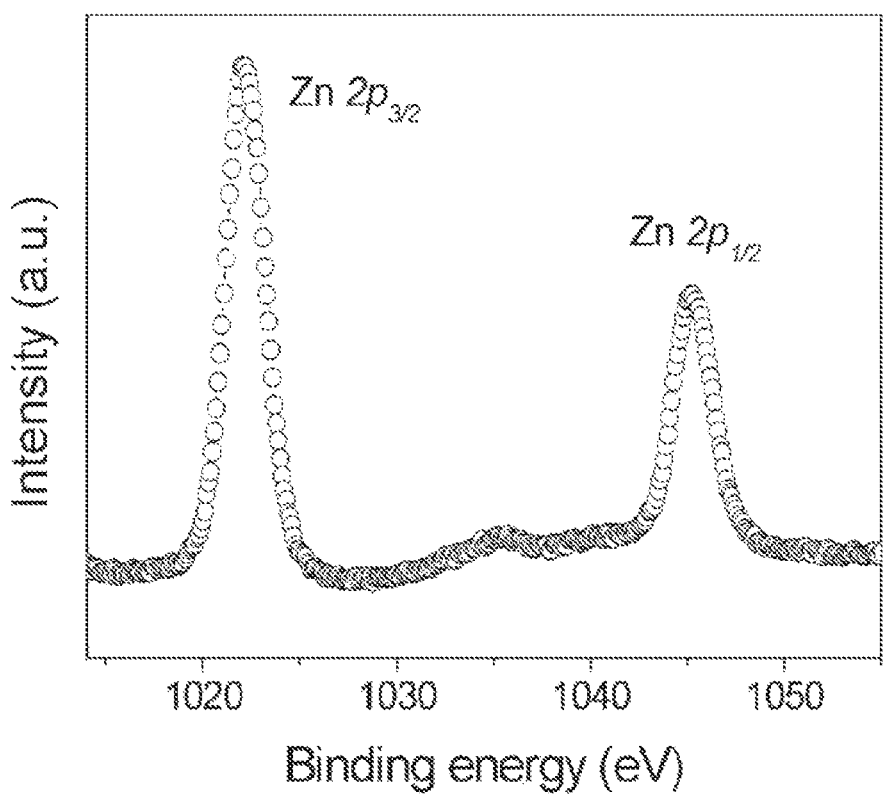
FIG. 4 illustrates XPS results of Zn $2p_{3/2}$ region in the IGZO thin film shown in FIG. 1.

FIGS. 2 to 5 illustrate XPS results of the respective element regions in the XPS graph of FIG. 1. That is, FIG. 2 illustrates XPS results of In $3d_{3/2}$ region in the IGZO thin film, FIG. 3 illustrates XPS results of Ga $2p_{3/2}$ region in the IGZO thin film, and FIG. 4 illustrates XPS results of Zn $2p_{3/2}$ region in the IGZO thin film.

Meanwhile, FIG. 5 illustrates an O 1s peak as XPS results in the IGZO thin film. The O 1s peak is divided into three peaks by means of Gaussian fitting. That is, $O_I$ (530.5±0.3 eV) indicates In—O, Ga—O, and Zn—O bonds in the IGZO structure, $O_{II}$ (531.5±0.3 eV) indicates oxygen vacancies in the IGZO structure, and $O_{III}$ (532.5±0.3 eV) indicates oxygen weakly isolated in the surface of the IGZO thin film. Kinds thereof include adsorbed —$CO_3$, $H_2O$ or $O_2$, and the respective rates are $O_I/O_{tot}$ (57.29%), $O_{II}/O_{tot}$ (22.69%), and $O_{III}/O_{tot}$ (20.02%). Accordingly, it can be seen that the IGZO thin film has a good chemical bond since rates of In—O, Ga—O, and Zn—O are less than the oxygen vacancies.

Fifth, an exemplary embodiment for forming an IZO sol will be described as follows.

An acetonitrile dispersion medium of 40 ml is mixed with dispersoids containing Zinc chloride and Indium chloride each having substantially 0.5 or 0.7 molar concentration to form a dispersion system. The dispersion system is then stirred at 60° C. for 1 hour in a hot plate, and aged for 24 hours to form a uniform, stable and aged dispersion system. Meanwhile, since the Zinc chloride and Indium chloride are very susceptible to moisture, the process may be carried out within a moistureless glove box where the moisture may be easily adjusted. Accordingly, the IZO sol is formed.

Sixth, another exemplary embodiment for forming an IZO sol will be described as follows.

A 2-methoxyethanol dispersion medium of 20 ml is mixed with dispersoids containing Zinc acetate dihydrate and Indium acetate hydrate each having substantially 0.5 or 0.7 molar concentration to form a dispersion system. A sol stabilizer, i.e., mono-ethanolamine having substantially the same molar ratio as Zinc acetate dihydrate, is then mixed with the formed dispersion system. The dispersion system is then stirred at 60° C. for 1 hour in a hot plate, and is aged for 24 hours to form a uniform, stable and aged dispersion system. Accordingly, the IZO sol is formed.

Seventh, an exemplary embodiment for forming an SZO sol will be described as follows.

A 2-methoxyethanol dispersion medium of 20 ml is mixed with dispersoids containing Zinc acetate dihydrate and Tin acetate each having substantially 0.7 molar concentration to form a dispersion system. A sol stabilizer, i.e., mono-ethanolamine having substantially the same molar ratio as Zinc acetate dihydrate, is then mixed with the formed dispersion system. The dispersion system is then stirred at 60° C. for 1 hour in a hot plate, and is aged for 24 hours to form a uniform, stable and aged dispersion system. Accordingly, the SZO sol is formed.

Eighth, another exemplary embodiment for forming an SZO sol will be described as follows.

An acetonitrile dispersion medium of 40 ml is mixed with dispersoids containing Zinc chloride and Tin chloride each having substantially 0.5 or 0.7 molar concentration to form a dispersion system. The dispersion system is then stirred at 60° C. for 1 hour in a hot plate, and is aged for 24 hours to form a uniform, stable and aged dispersion system. In this case, since the Zinc chloride and Tin chloride are very susceptible to moisture, the process may be carried out within a moistureless glove box where the moisture may be easily adjusted. Accordingly, the SZO sol is formed.

Ninth, an exemplary embodiment for forming an ISZO sol will be described as follows.

An acetonitrile dispersion medium of 40 ml is mixed with dispersoids containing Zinc chloride, Tin chloride, and Indium chloride each having substantially 0.5 or 0.7 molar concentration to form a dispersion system. The dispersion system is then stirred at 60° C. for 1 hour in a hot plate, and is aged for 24 hours to form a uniform, stable and aged dispersion system. In this case, since the Zinc chloride, Tin chloride, and Indium chloride are very susceptible to moisture, the process may be carried out within a moistureless glove box where the moisture may be easily adjusted. Accordingly, the ISZO sol is formed.

Tenth, another exemplary embodiment for forming an ISZO sol will be described as follows.

A 2-methoxyethanol dispersion medium of 40 ml is mixed with dispersoids containing Zinc acetate dihydrate, Tin acetate, and Indium acetate hydrate each having substantially 0.7 molar concentration to form a dispersion system. A sol stabilizer, i.e., mono-ethanolamine having substantially the same molar ratio as Zinc acetate dihydrate is then mixed with the formed dispersion system. The dispersion system is then stirred at 60° C. for 1 hour in a hot plate, and is aged for 24 hours to form a uniform, stable and aged dispersion system. Accordingly, the ISZO sol is formed.

Eleventh, an exemplary embodiment for forming an SGZO sol will be described as follows.

An acetonitrile dispersion medium of 40 ml is mixed with dispersoids containing Zinc chloride, Tin chloride, and Gallium chloride each having substantially 0.5 or 0.7 molar concentration to form a dispersion system. The dispersion system is then stirred at 60° C. for 1 hour in a hot plate, and is aged for 24 hours to form a uniform, stable and aged dispersion system. In this case, since the Zinc chloride, Tin chloride, and Gallium chloride are very susceptible to moisture, the process may be carried out within a moistureless glove box where the moisture may be easily adjusted. Accordingly, the SGZO sol is formed.

Twelfth, an exemplary embodiment for forming a TZO sol will be described as follows.

A 2-methoxyethanol dispersion medium of 20 ml is mixed with dispersoids containing Zinc acetate dihydrate and Thallium acetate each having substantially 0.7 molar concentration to form a dispersion system. A sol stabilizer, i.e., mono-ethanolamine having substantially the same molar ratio as Zinc acetate dihydrate is then mixed with the formed dispersion system. The dispersion system is then stirred at 60° C. for 1 hour in a hot plate, and is aged for 24 hours to form a uniform, stable and aged dispersion system. Accordingly, the TZO sol is formed.

Thirteenth, another exemplary embodiment for forming a TZO sol will be described as follows.

An acetonitrile dispersion medium of 20 ml is mixed with dispersoids containing Zinc chloride and Thallium chloride each having substantially 0.5 or 0.7 molar concentration to form a dispersion system. The dispersion system is then stirred at 60° C. for 1 hour in a hot plate, and is aged for 24 hours to form a uniform, stable and aged dispersion system. In this case, since the Zinc chloride and Thallium chloride are very susceptible to moisture, the process may be carried out within a moistureless glove box where the moisture may be easily adjusted. Accordingly, the TZO sol is formed.

Fourteenth, an exemplary embodiment for forming a TGZO sol will be described as follows.

An acetonitrile dispersion medium of 40 ml is mixed with dispersoids containing Zinc chloride, Thallium chloride, and Gallium chloride each having substantially 0.5 or 0.7 molar concentration to form a dispersion system. The dispersion system is then stirred at 60° C. for 1 hour in a hot plate, and is aged for 24 hours to form a uniform, stable and aged dispersion system. In this case, since the Zinc chloride, Thallium chloride, and Gallium chloride are very susceptible to moisture, the process may be carried out within a moistureless glove box where the moisture may be easily adjusted. Accordingly, the TGZO sol is formed.

Meanwhile, in the exemplary embodiments described above, the molar concentration of the dispersoid mixed with the dispersion medium determines a thickness of the thin film when the resultant sol is produced to be thin-filmed. For example, it is difficult to form the thin film when the molar concentration of the dispersoid is much lower than the molar concentrations illustrated in the respective exemplary embodiments, and the dispersoid has a solubility greater than that of the dispersion medium causing precipitation when the molar concentration of the dispersoid is much higher than the molar concentrations illustrated in the respective exemplary embodiments, so that it is preferable to set molar concentrations of the dispersoids suitable for the respective exemplary embodiments.

Exemplary embodiments of the present invention have been disclosed with respect to a method of fabricating a liquid for an oxide thin film and, although specific terms are employed, they are used and are to be interpreted in a generic and descriptive sense only and not for purpose of limitation. Accordingly, it will be understood by those of ordinary skill, in the art that various changes in form and details may be made without departing from the spirit and scope of the present invention as set forth in the following claims.

The invention claimed is:

1. A liquid for an oxide thin film comprising:
   a first compound selected from a zinc compound;
   a second compound selected from the group consisting of an indium compound, a gallium compound, a tin compound, a thallium compound and combinations thereof; and
   a stabilizer having substantially the same molar ratio as the zinc compound,
   wherein a molar ratio of the first compound to the second compound is 1:0.1 to 1:2.

2. The liquid according to claim 1, wherein a molar concentration of each of the first compound and the second compound is 0.1M to 10M.

3. The liquid according to claim 2, wherein the zinc compound comprises zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, or zinc tetrafluoroborate hydrate zinc perchlorate hexahydrate.

4. The liquid according to claim 2, wherein the indium compound comprises indium chloride, indium chloride tetrahydrate, indium fluoride, indium fluoride trihydrate, indium hydroxide, indium nitrate hydrate, indium acetate hydrate, indium acetylacetone or indium acetate.

5. The liquid according to claim 2, wherein the tin compound comprises tin acetate, tin chloride, tin chloride dehydrate, tin chloride pentahydrate, or tin fluoride.

6. The liquid according to claim 2, wherein the thallium compound comprises thallium acetate, thallium acetylacetone, thallium chloride, thallium chloride tetrahydrate, thallium cyclopentadienide, thallium fluoride, thallium formate, thallium hexafluoroacetylacetonate, thallium nitride, thallium nitrate trihydrate, thallium trifluoroacetate, or thallium perchlorate hydrate.

7. The liquid according to claim 1, wherein the stabilizer comprises mono-ethanolamine, di-ethanolamine, tri-ethanolamine or combinations thereof.

8. The liquid according to claim 1, wherein the zinc compound comprises zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, or zinc tetrafluoroborate hydrate zinc perchlorate hexahydrate.

9. The liquid according to claim 8, wherein the stabilizer comprises mono-ethanolamine, di-ethanolamine, tri-ethanolamine or combinations thereof.

10. The liquid according to claim 1, wherein the indium compound comprises indium chloride, indium chloride tetrahydrate, indium fluoride, indium fluoride trihydrate, indium hydroxide, indium nitrate hydrate, indium acetate hydrate, indium acetylacetone or indium acetate.

11. The liquid according to claim 1, wherein the tin compound comprises tin acetate, tin chloride, tin chloride dehydrate, tin chloride pentahydrate, or tin fluoride.

12. The liquid according to claim 1, wherein the thallium compound comprises thallium acetate, thallium acetylacetone, thallium chloride, thallium chloride tetrahydrate, thallium cyclopentadienide, thallium fluoride, thallium formate, thallium hexafluoroacetylacetonate, thallium nitride, thallium nitrate trihydrate, thallium trifluoroacetate, or thallium perchlorate hydrate.

13. The liquid according to claim 1, further comprising solvents for the first and the second compounds, the solvent being selected from the group consisting of isopropanol, 2-methoxyethanol, dimethylformamide, ethanol, deionized water, methanol, acetylacetone, dimethylamineborane, and acetonitrile.

14. A liquid for an oxide thin film comprising:
   a first compound selected from a zinc compound;
   a second compound selected from the group consisting of an indium compound, a gallium compound, a tin compound, a thallium compound and combinations thereof; and
   a pH controlling agent for adjusting pH of the liquid, wherein the pH controlling agent comprises acetic acid, ammonium hydroxide, potassium hydroxide, or sodium hydroxide, and
   wherein a molar ratio of the first compound to the second compound is 1:0.1 to 1:2.

15. A method of forming an oxide film comprising:
   preparing an oxide liquid; and
   depositing the oxide liquid,
   wherein preparing the oxide liquid comprising:
   mixing a first compound selected from a zinc compound, a second compound selected from the group consisting of an indium compound, a gallium compound, a tin compound, a thallium compound and combinations thereof, and a stabilizer having substantially the same molar ratio as the zinc compound,
   wherein a molar ratio of the first compound to the second compound is 1:0.1 to 1:2.

16. The method according to claim 15, wherein a molar concentration the first compound is 0.1M to 10M and a molar concentration of the second compound is 0.1M to 10M.

* * * * *